(12) United States Patent
Kwon et al.

(10) Patent No.: US 9,293,414 B2
(45) Date of Patent: Mar. 22, 2016

(54) ELECTRONIC FUSE HAVING A SUBSTANTIALLY UNIFORM THERMAL PROFILE

(71) Applicant: GLOBALFOUNDRIES Inc., Grand Cayman (KY)

(72) Inventors: O Sung Kwon, Wappingers Falls, NY (US); Xiaoqiang Zhang, Rexford, NY (US); Anurag Mittal, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/551,249

(22) Filed: Nov. 24, 2014

(65) Prior Publication Data
US 2015/0076656 A1    Mar. 19, 2015

Related U.S. Application Data

(63) Continuation-in-part of application No. 13/928,060, filed on Jun. 26, 2013, now Pat. No. 8,981,492.

(51) Int. Cl.
| | |
|---|---|
| H01L 23/522 | (2006.01) |
| H01L 29/00 | (2006.01) |
| H01L 27/06 | (2006.01) |
| H01L 27/108 | (2006.01) |
| H01L 23/525 | (2006.01) |
| H01L 23/367 | (2006.01) |
| H01L 23/532 | (2006.01) |
| H01L 27/10 | (2006.01) |

(52) U.S. Cl.
CPC ........ *H01L 23/5256* (2013.01); *H01L 23/3677* (2013.01); *H01L 23/5226* (2013.01); *H01L 27/0629* (2013.01); *H01L 23/53228* (2013.01); *H01L 23/53257* (2013.01); *H01L 27/101* (2013.01); *H01L 2924/0002* (2013.01)

(58) Field of Classification Search
CPC ..................... H01L 21/76889; H01L 23/5225; H01L 27/0629; H01L 23/367; H01L 23/53257; H01L 23/53228; H01L 23/53209; H01L 23/5226; H01L 27/0617; H01L 21/76838; H01L 21/84; H01L 23/5256; H01L 27/1203
USPC ...................................... 257/529, E23.149, 39
See application file for complete search history.

(56) References Cited

U.S. PATENT DOCUMENTS

| | | |
|---|---|---|
| 6,274,409 B1 | 8/2001 | Choi |
| 6,356,496 B1 | 3/2002 | Carroll et al. |
| 6,720,820 B1 | 4/2004 | Chuang et al. |

(Continued)

OTHER PUBLICATIONS

Office Action from related U.S. Appl. No. 14/581,171 dated Sep. 15, 2015.

*Primary Examiner* — Kimberly Rizkallah
*Assistant Examiner* — Brian Turner
(74) *Attorney, Agent, or Firm* — Amerson Law Firm, PLLC

(57) ABSTRACT

An electronic fuse includes a body, an anode coupled to the body, and a cathode coupled to the body. Each of the anode and the cathode includes a first line contacting the body. The first line is discontinuous along its length and includes a first portion and a second portion with a space therebetween. A second line is disposed above the first line and a plurality of vias couple the first and second lines. The first portion of the first line is coupled to a first subset of the plurality of vias and the second portion of the first line is coupled to a second subset of the vias.

18 Claims, 3 Drawing Sheets

(56) References Cited

U.S. PATENT DOCUMENTS

| | | |
|---|---|---|
| 7,098,721 B2 | 8/2006 | Ouellette et al. |
| 7,129,769 B2 | 10/2006 | Dixon et al. |
| 7,381,594 B2 | 6/2008 | Hsu et al. |
| 7,382,036 B2 | 6/2008 | Nowak et al. |
| 7,394,089 B2 | 7/2008 | Doyle et al. |
| 7,434,127 B2 | 10/2008 | Riley |
| 7,477,555 B2 | 1/2009 | Anand et al. |
| 7,489,180 B2 | 2/2009 | Marshall |
| 7,489,572 B2 | 2/2009 | Aipperspach et al. |
| 7,491,965 B2 | 2/2009 | Doyle et al. |
| 7,501,345 B1 | 3/2009 | Basker et al. |
| 7,501,879 B1 | 3/2009 | Oh et al. |
| 7,572,724 B2 | 8/2009 | Nowak et al. |
| 7,659,168 B2 | 2/2010 | Hsu et al. |
| 7,902,903 B2 | 3/2011 | Rosik et al. |
| 7,960,809 B2 | 6/2011 | Kothandaraman et al. |
| 7,977,754 B2 | 7/2011 | Chuang et al. |
| 8,003,461 B1 | 8/2011 | Hsu et al. |
| 8,004,059 B2 | 8/2011 | Kim et al. |
| 8,035,191 B2 | 10/2011 | Lin et al. |
| 8,071,437 B2 | 12/2011 | Lin et al. |
| 8,134,854 B2 | 3/2012 | Huang |
| 8,279,700 B2 | 10/2012 | Wada et al. |
| 8,294,239 B2 | 10/2012 | Min |
| 8,299,570 B2 | 10/2012 | Kim et al. |
| 8,304,839 B2 | 11/2012 | Thei et al. |
| 8,324,046 B2 | 12/2012 | Thei et al. |
| 8,329,515 B2 | 12/2012 | Yang et al. |
| 2002/0113291 A1* | 8/2002 | Adkisson et al. ............ 257/529 |
| 2004/0080357 A1 | 4/2004 | Chuang et al. |
| 2005/0059256 A1* | 3/2005 | Watanabe ................ 438/725 |
| 2005/0082635 A1* | 4/2005 | Kang et al. ............... 257/528 |
| 2005/0285222 A1* | 12/2005 | Thei et al. ................ 257/529 |
| 2005/0286332 A1 | 12/2005 | Uvieghara |
| 2006/0113547 A1 | 6/2006 | Shin |
| 2006/0157819 A1 | 7/2006 | Wu |
| 2006/0187709 A1 | 8/2006 | Ogura et al. |
| 2006/0203592 A1 | 9/2006 | Uvieghara |
| 2006/0203593 A1 | 9/2006 | Uvieghara |
| 2007/0081396 A1 | 4/2007 | Gordon et al. |
| 2007/0210413 A1* | 9/2007 | Booth et al. ............... 257/529 |
| 2007/0222028 A1 | 9/2007 | Matsuoka et al. |
| 2008/0217735 A1* | 9/2008 | Chen et al. ................ 257/529 |
| 2009/0001506 A1 | 1/2009 | Kim et al. |
| 2009/0039462 A1 | 2/2009 | Huang |
| 2009/0079439 A1 | 3/2009 | Kuo |
| 2009/0175106 A1 | 7/2009 | Aipperspach et al. |
| 2009/0256235 A1* | 10/2009 | Takaoka et al. ............ 257/529 |
| 2009/0283840 A1 | 11/2009 | Coolbaugh et al. |
| 2009/0310266 A1 | 12/2009 | Etherton et al. |
| 2010/0067319 A1 | 3/2010 | Aipperspach et al. |
| 2010/0078727 A1 | 4/2010 | Min et al. |
| 2010/0232248 A1 | 9/2010 | Erickson et al. |
| 2010/0252908 A1* | 10/2010 | Schlarmann ............. 257/529 |
| 2011/0083057 A1 | 4/2011 | Huang |
| 2011/0189827 A1 | 8/2011 | Hsu et al. |
| 2012/0187529 A1 | 7/2012 | Maciejewski et al. |
| 2012/0196423 A1 | 8/2012 | Kanike et al. |
| 2013/0056846 A1* | 3/2013 | Takeda .................. 257/529 |
| 2013/0082347 A1 | 4/2013 | Chen et al. |

* cited by examiner

ELECTRONIC FUSE HAVING A SUBSTANTIALLY UNIFORM THERMAL PROFILE

CROSS-REFERENCE TO RELATED APPLICATION

This is a continuation-in-part of co-pending application Ser. No. 13/928,060, filed Jun. 26, 2013.

BACKGROUND OF THE INVENTION

1. Field of the Invention

Generally, the present disclosure relates to the manufacture of semiconductor devices, and, more specifically, to an electronic fuse having a substantially uniform thermal profile.

2. Description of the Related Art

In modern integrated circuits, a very high number of individual circuit elements, such as field effect transistors in the form of CMOS, NMOS, PMOS elements, resistors, capacitors and the like, are formed on a single chip area. In addition to the large number of transistor elements, a plurality of passive circuit elements, such as capacitors, resistors and the like, are typically formed in integrated circuits that are used for a plurality of purposes, such as for decoupling.

For a variety of reasons, the various circuit portions may have significantly different performance capabilities, for instance with respect to useful lifetime, reliability and the like. For example, the operating speed of a digital circuit portion, such as a CPU core and the like, may depend on the configuration of the individual transistor elements and also on the characteristics and performance of the metallization system coupled to the CPU core. Consequently, the combination of the various circuit portions in a single semiconductor device may result in a significantly different behavior with respect to performance and reliability. Variations in the overall manufacturing process flow may also contribute to further variations in the performance capabilities between various circuit portions. For these reasons, in complex integrated circuits, frequently additional mechanisms are used so as to allow the circuit itself to adapt or change the performance of certain circuit portions to comply with the performance characteristics of other circuit portions. Such mechanisms are typically used after completing the manufacturing process and/or during use of the semiconductor device. For example, when certain critical circuit portions no longer comply with corresponding device performance criteria, adjustments may be made, such as re-adjusting an internal voltage supply, re-adjusting the overall circuit speed and the like, to correct such underperformance.

In integrated circuits, electronic fuses, commonly referred to as "e-fuses," are used to facilitate the dynamic, real-time reprogramming of computer chips. Speaking abstractly, computer logic is generally "hard-coded" onto a silicon chip and cannot be changed after the chip has been manufactured. By utilizing one or more e-fuses, a chip manufacturer can change some aspects of the circuits on a chip. If a certain sub-system fails, is taking too long to respond, or is consuming too much power, the chip can instantly change its behavior by "programming" an e-fuse. Programming of an e-fuse is typically accomplished by forcing a large electrical current through the e-fuse. This high current is intended to break or rupture a portion of the e-fuse structure, which results in an "open" electrical path, and changes the circuit routing. Fuses are frequently used in integrated circuits to program (or make a selection between) redundant elements or to effectively replace defective elements with an identical functional element. Further, e-fuses can be used to store die identification or other information, or to adjust the speed of a circuit by adjusting the resistance of the current path. Device manufacturers are under constant pressure to produce integrated circuit products with increased performance and lower power consumption relative to previous device generations. This drive applies to the manufacture and use of e-fuses as well.

As noted above, programming an e-fuse generally involves passing a current though the e-fuse of sufficient magnitude such that, due to resistance heating, some portion or component of the e-fuse ruptures, thereby creating an open electrical circuit. After programming the e-fuse, the ruptured portion should be substantially uniform across its width. Any significant non-uniformities can result in incomplete programming, causing faults or improper operation.

The present disclosure is directed to various methods of making an e-fuse for use on integrated circuit products and the resulting integrated circuit product.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to an e-fuse for use on integrated circuit products. One illustrative electronic fuse disclosed herein includes, among other things, a body, an anode coupled to the body, and a cathode coupled to the body. Each of the anode and the cathode includes a first line contacting the body. The first line is discontinuous along its length and includes a first portion and a second portion with a space therebetween. A second line is disposed above the first line and a plurality of vias couple the first and second lines. The first portion of the first line is coupled to a first subset of the plurality of vias and the second portion of the first line is coupled to a second subset of the vias.

Another illustrative electronic fuse disclosed herein includes, among other things, a body, an anode coupled to the body, and a cathode coupled to the body. Each of the anode and the cathode comprises a first line contacting the body. The first line has a central portion having a first width and end portions having a second width greater than the first width. A second line is disposed above the first line. A plurality of vias couple the first and second lines.

Yet another illustrative electronic fuse disclosed herein includes, among other things, a body, an anode coupled to the body, and a cathode coupled to the body. Each of the anode and the cathode includes a first line contacting the body, a second line disposed above the first line, and a plurality of vias coupling the first and second lines. A heat sink including a metal material is disposed between the anode and the cathode and above a central region of the body.

BRIEF DESCRIPTION OF THE DRAWINGS

The disclosure may be understood by reference to the following description taken in conjunction with the accompanying drawings, in which like reference numerals identify like elements, and in which.

Figure 1A:
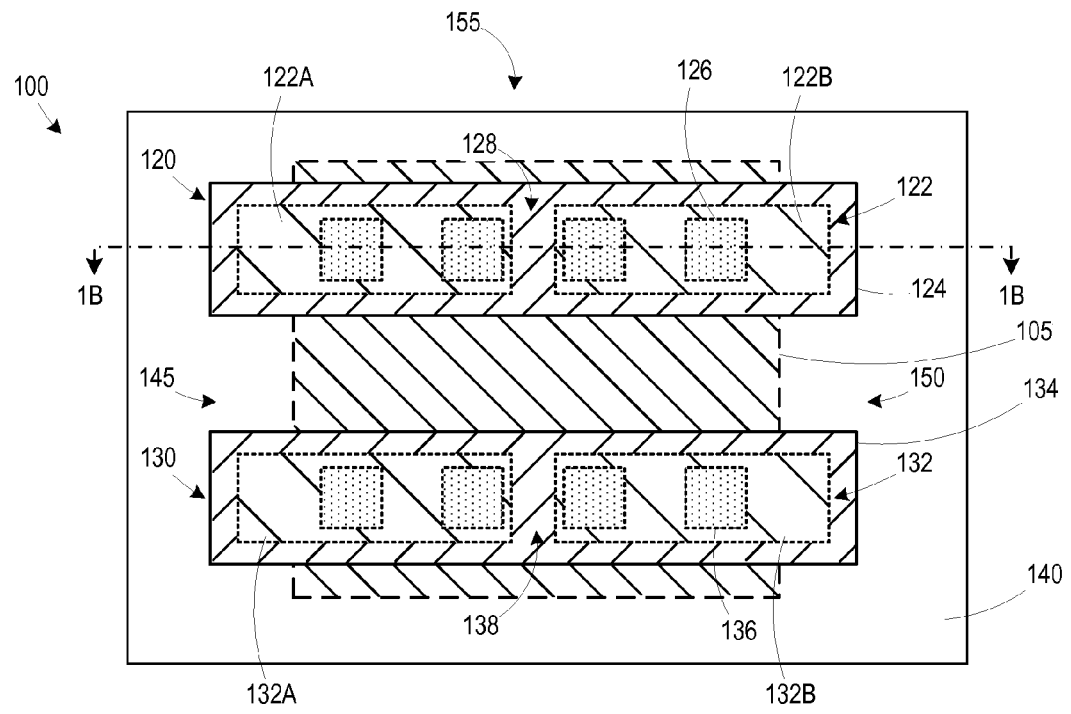
FIGS. 1A-1C depict views of an exemplary electronic fuse having a discontinuous current distributing line.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of an electronic fuse, or e-fuse, for use on integrated circuit products. As will be readily apparent to those skilled in the art upon a complete reading of the present application, the various embodiments of the novel e-fuses disclosed herein may be employed on any type of integrated circuit product, including, but not limited to, logic devices, memory devices, ASICs, so-called system-on-chip products, etc. With reference to the attached figures, various illustrative embodiments of the novel devices disclosed herein will now be described in more detail.

Figure 1B:
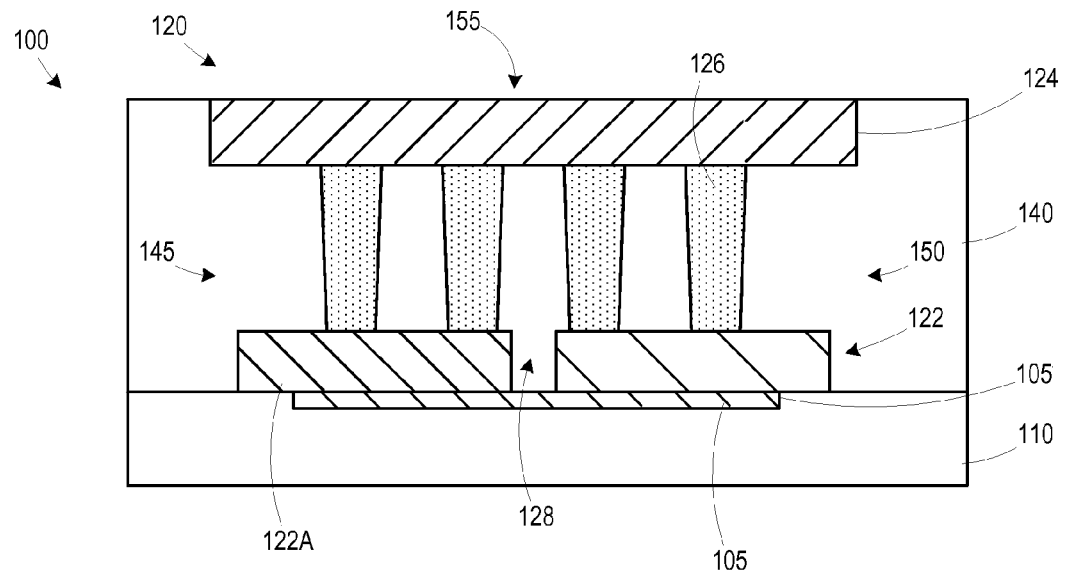

FIGS. 1A and 1B depict side and top views, respectively, of an exemplary electronic fuse 100 disclosed herein having a discontinuous current distributing line. The e-fuse 100 includes a body 105 formed above a first dielectric layer 110. The body 105 may be formed of a layer of a conductive material, such as a metal silicide, e.g., tungsten silicide, titanium silicide, etc. The e-fuse 100 includes an anode 120 and a cathode 130 coupled to the body 105. In the depicted example, the anode 120 and the cathode 130 have the same physical structure. That is, the anode 120 and cathode 130 each include, respectively, a first current distributing line 122, 132, a second current distributing line 124, 134, and a plurality of vias 126, 136 connecting therebetween. Only the cross-sectional view of the anode 120 is depicted in FIG. 1B. The lines 122, 124, 132, 134 and vias 126, 136 are embedded in a second dielectric layer 140. The dielectric layers 110, 140 are intended to be representative in nature as they may be comprised of one or more layers of insulating material, e.g., silicon dioxide, silicon nitride, a low-k material, etc. The lines 122, 124, 132, 134 and vias 126, 136 may comprise the same materials or different materials. In the illustrated embodiment, the lines 122, 132 are tungsten, the vias 126, 136 are tungsten or copper, and the lines 124, 134 are copper. When copper materials are used, one or more barrier layers (not shown) may be provided to inhibit migration of the copper into the material of the dielectric layers 110, 140.

The lines 122, 124, 132, 134 and vias 126, 136 may be formed concurrently with the formation of any conductive structures in any metallization layer for the integrated circuit product, including device level conductive structures and general metallization layers above the device level contact structures. In one embodiment, the lines 122, 124, 132, 134 and vias 126, 136 may be formed at the same time as the so-called contact level or device level connections are made to elements that are actually formed in the substrate. For example, the body 105 may be considered part of a device metallization layer, the lines 122, 132 may be part of a "CA" device metallization layer, the vias 126, 136 may be referred to as "V0" structures, and the lines 124, 134 may be formed at the same time as other metal lines, referred to as "M1" lines, are formed in the M1 metallization layer. In general, the M1 metallization layer is the first major wiring level of the product 100 that establishes the means by which the various circuits formed on the product 100 are conductively coupled together to form a functioning integrated circuit product. Typically, a modern integrated circuit product will have several metallization layers formed above the M1 metallization layer. Various patterning techniques and formation techniques, such as damascene (e.g., for copper) or dual damascene processes, known to those of ordinary skill in the art may be employed to form the e-fuse 100.

In general, due to the configuration and structure of the e-fuse 100, ambient heat dissipation from the e-fuse 100 is greater from the end regions 145, 150 than heat dissipation from the central region 155. Without compensation for these differences in heat dissipation rates and/or amounts, the unbalanced thermal profile of the e-fuse 100 could be such that the heat generated by current flow through the e-fuse 100 to cause the rupture of the body 105 would be greater in the central region 155, causing it to rupture first and more completely than in the end regions 145, 150. This situation could give rise to programming faults or less reliable programming and circuit operation. In one example, the central region 155 may be considered to be the middle 20-50% of the axial length of the body 105.

To provide a substantially uniform thermal profile for the e-fuse 100 disclosed herein, the lines 122, 132 include one or more discontinuities 128, 138 along their respective lengths. The discontinuities 128, 138 are provided in the central region 155 of the e-fuse 100. As a result, the lines 122, 132 each include a first portion 122A, 132A in the end region 145 coupled to a first subset of the respective vias 126, 136 and a second portion 122B, 132B in the end region 150 coupled to a second subset of the respective vias 126, 136. Due to the discontinuities 128, 138, the heat generated by flowing current in end regions 145, 150 of the e-fuse 100 is greater than the heat generated in the central region 155, because the current does not flow in the region of the discontinuities 128, 138. The current difference results in increased ohmic heating in the end regions 145, 150 relative to the central region 155, thereby taking advantage of the increased ambient heat dissipation characteristics of the end regions 145, 150 relative to the central region 155. As a result, the thermal profile generated during the programming of the e-fuse 100 is substantially more uniform across the body 105, providing increased programming reliability.

Figure 1C:
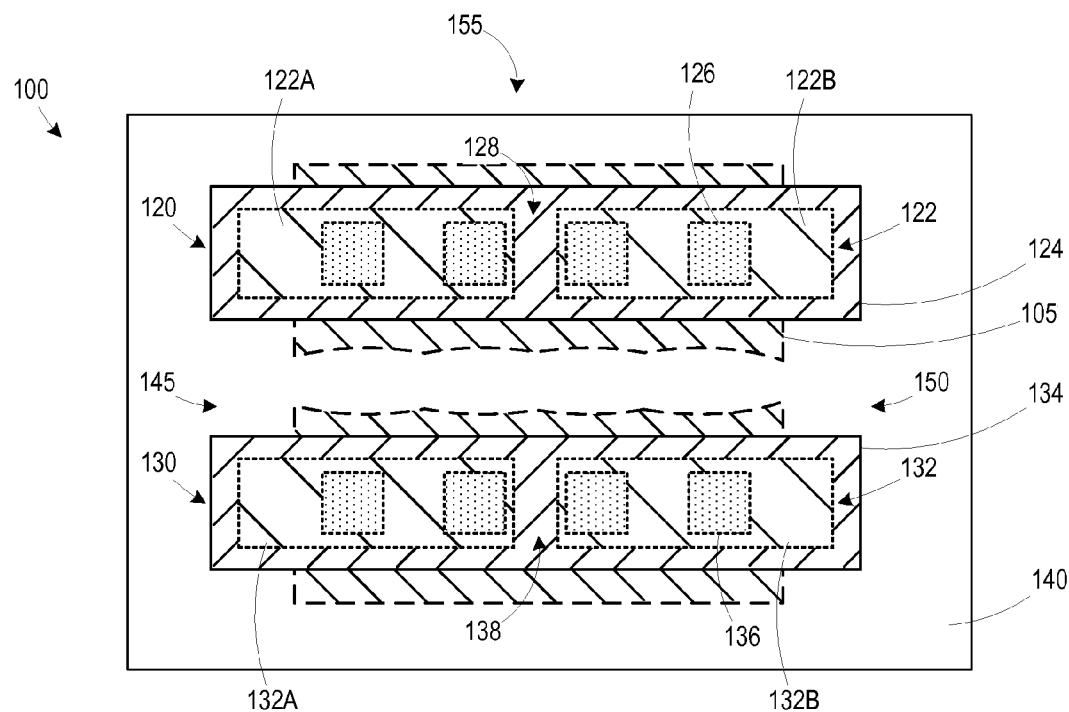

FIG. 1C illustrates one illustrative example of the e-fuse 100 after an appropriate programming current is directed to the anode 120 or cathode 130 to rupture the body 105 due to metal migration and/or resistance heating, thereby creating an open circuit. In some embodiments, programming the e-fuse 100 may entail modifying the body 105 to significantly increase its resistance without completely rupturing the body 105. This increased resistance may be detected to identify the program state of the e-fuse 100. The extent of the rupturing of the body 105 may vary depending upon the particular application. In the programmed state, the e-fuse 100 cannot conduct current through the ruptured body 105, or its resistance is significantly increased. The magnitude of the programing current will vary depending upon the particular application, e.g., 3-10 mA.

Figure 2:
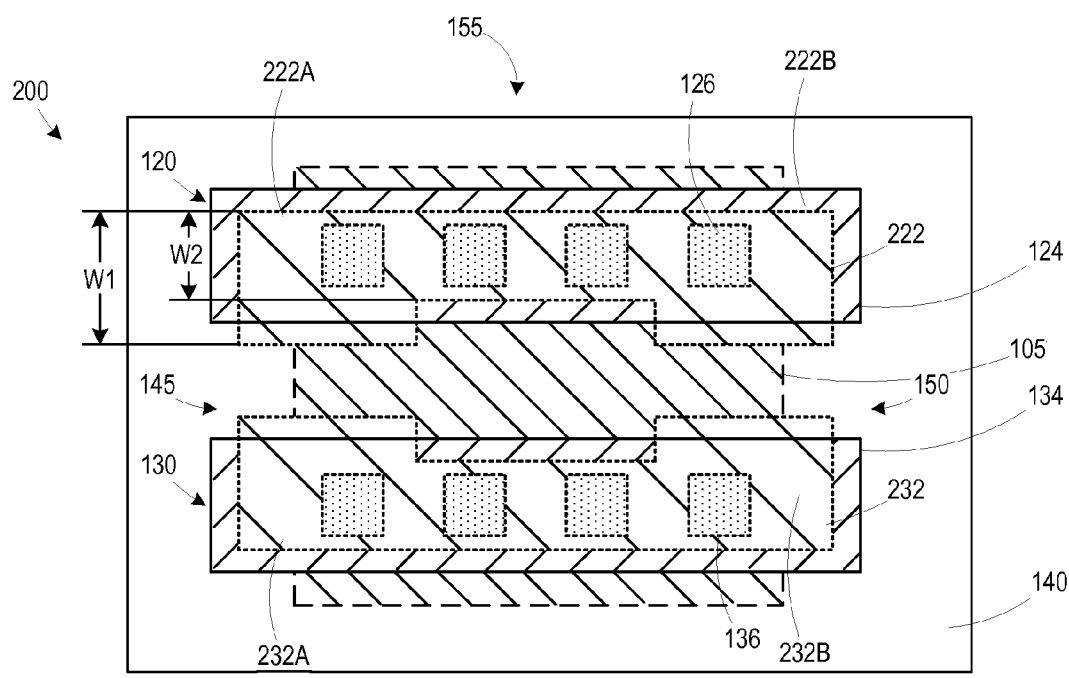
FIG. 2 depicts a top view of an alternative embodiment of an electronic fuse having a current distributing line with a non-uniform width profile along its length.

FIG. 2 depicts a top view of an alternative embodiment of an electronic fuse 200 having current distributing lines 222, 232 with a non-uniform width profile along its length. To provide a substantially uniform thermal profile for the e-fuse 200, the lines 222, 232 include one or more end portions 222A, 232A having widths W1 greater than the widths W2 of the respective central portions 222B, 232B. The proportion of the lines 222, 232 that define the central portion 222B, 232B relative to the end portions 222A, 232A may vary depending on the particular implementation. Due to the presence of the increased width end portions 222A, 232A, the current in end regions 145, 150 of the e-fuse 200 is greater than the current in the central region 155. The current density difference results in increased ohmic heating in the end regions 145, 150 relative to the central region 155, thereby taking advantage of the increased ambient heat dissipation in the end regions 145, 150. As a result, the thermal profile generated during the programming of the e-fuse 200 is substantially more uniform across the body 105, providing increased programming reliability.

Figure 3A:
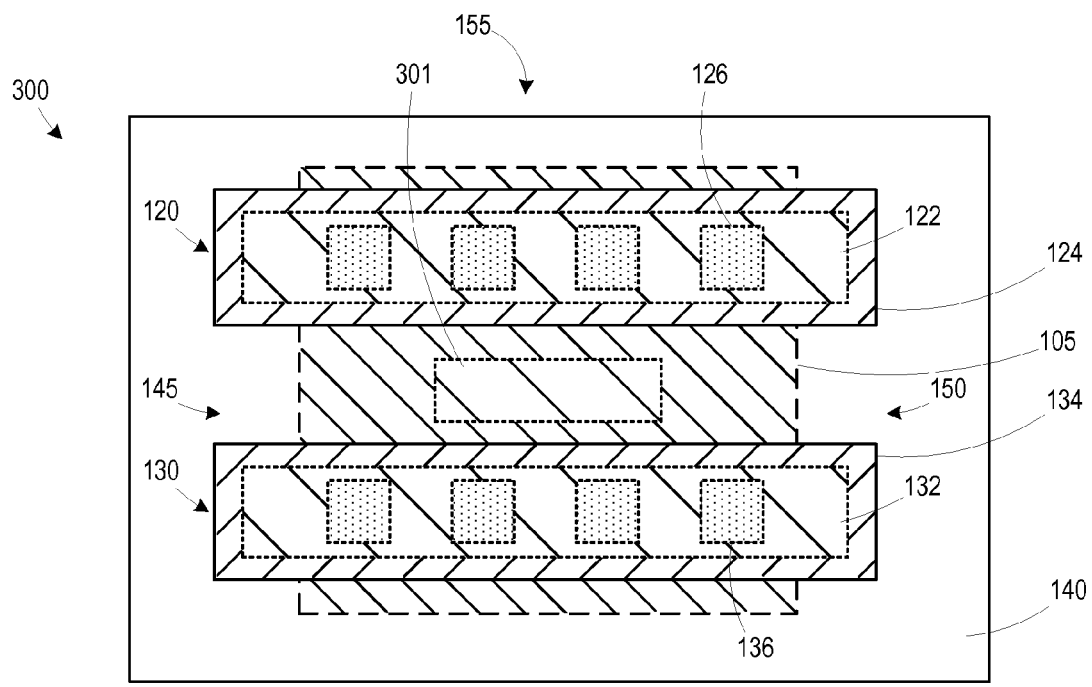
FIGS. 3A and 3B depict top views of yet another embodiment of an electronic fuse having a heat sink to alter its thermal profile.
Figure 3B:
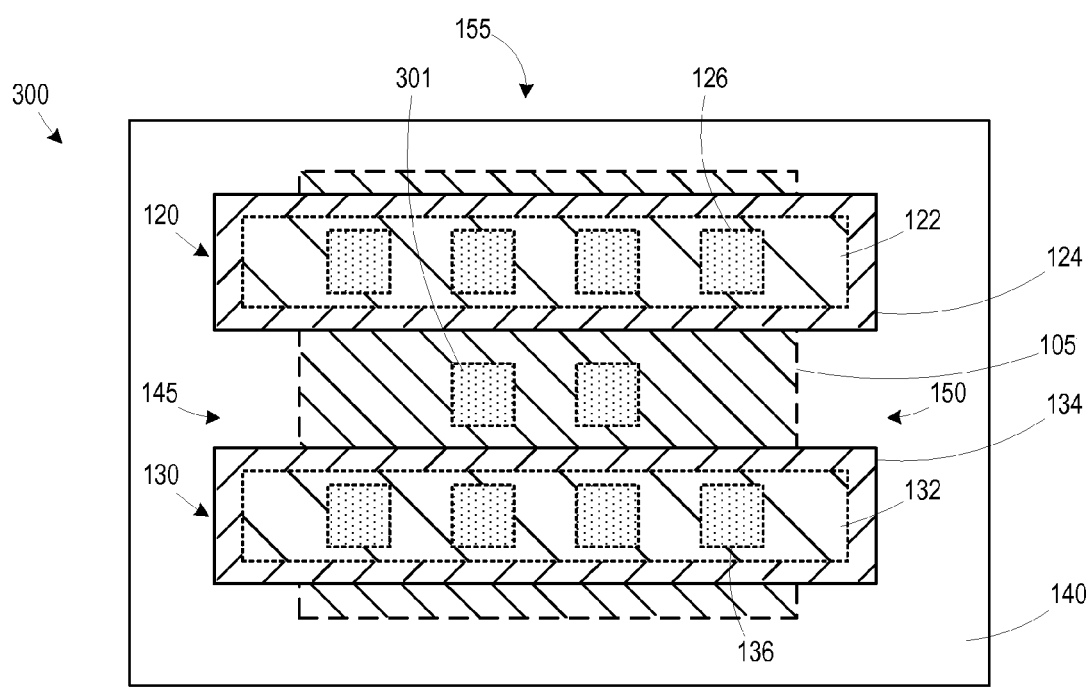

FIG. 3A depicts a top view of yet another embodiment of an electronic fuse 300 having a heat sink 301 disposed between the anode 120 and the cathode 130 in the central region 155 to alter its thermal profile. The heat sink 301 may be formed in the CA layer (as illustrated), the V0 layer or the M1 layer. The heat sink 301 may have a line structure 305 if formed in CA or M1 layers, or, as illustrated in FIG. 3B, the heat sink 301 may include one or more vias 305 disposed in the central region 155 if formed in the V0 layer concurrently with the vias 126, 136. In some embodiments, the heat sink 301 may include multiple structures, such as a first line in the CA level and a second line above the first line in the M1 layer. The heat sink 301 increases ambient heat dissipation from the central region 155, thereby compensating for what would otherwise be higher ambient heat dissipation from the end regions 145, 150. As a result, the thermal profile generated during the programming of the e-fuse 300 is substantially more uniform across the body 105, providing increased programming reliability.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An electronic fuse, comprising:
    a body having a width and a length, and, along its width, a first end region, a second end region, and a central region disposed between said first and second end regions;
    an anode coupled to said body; and
    a cathode coupled to said body and positioned parallel to and spaced apart from said anode in a length direction of said body, wherein each of said anode and said cathode comprises:
        a first line contacting said body, wherein said first line is discontinuous along its length and includes a first portion and a second portion with a space therebetween, said first portion contacts said first end region and said central region, and said second portion contacts said second end region and said central region;
        a second line disposed above said first line; and
        a plurality of vias coupling said first and second lines, wherein said first portion of said first line is coupled to a first subset of said plurality of vias and said second portion of said first line is coupled to a second subset of said plurality of vias not including vias in said first subset.

2. The fuse of claim 1, wherein at least one discontinuity is disposed in said central region.

3. The fuse of claim 1, wherein said body comprises a metal silicide.

4. The fuse of claim 1, wherein said first line comprises tungsten.

5. The fuse of claim 1, wherein said plurality of vias comprise copper.

6. The fuse of claim 1, wherein said second line comprises copper.

7. An electronic fuse, comprising:
    a body having a width and a length and, along its width, a first end region, a second end region, and a central region disposed between said first and second end region in a width direction;
    an anode coupled to said body; and
    a cathode coupled to said body and positioned parallel to and spaced apart from said anode in a length direction of said body, wherein each of said anode and said cathode comprises:

a first line contacting said body along said width direction, wherein said first line comprises a first end portion contacting said first end region, a second end portion contacting said second end region, and a central portion positioned between said first and second end portions and contacting said central region, said central portion having a first width in said length direction and said first and second end portions each having a second width in said length direction greater than said first width;

a second line disposed above said first line; and a plurality of vias coupling said first and second lines.

8. The fuse of claim 7, wherein said body comprises a metal silicide.

9. The fuse of claim 7, wherein said first line comprises tungsten.

10. The fuse of claim 7, wherein said plurality of vias comprise copper.

11. The fuse of claim 7, wherein said second line comprises copper.

12. An electronic fuse, comprising:

a body having a width and a length, and including along its width, a first end region, a second end region, and a central region disposed between said first and second end regions in a width direction, and, along its length, first and second ends;

a cathode coupled to said body, wherein said cathode comprises:

a first line contacting said body along said width direction in said first and second end regions and said central region at said first end of said body;

a second line disposed above said first line and parallel to said first line;

a first plurality of vias coupling said first and second lines;

an anode coupled to said body, wherein said anode comprises:

a third line contacting said body in said first and second end regions and said central region in said width direction at said second end of said body, wherein said first and third lines are parallel to one another;

a fourth line disposed above said third line and parallel to said third line; and a second plurality of vias coupling said third and fourth lines; and a heat sink comprising a fifth line positioned between and parallel to said first and third lines, said heat sink comprising a metal material disposed between said anode and said cathode and above a central region of said body.

13. The fuse of claim 12, wherein fifth line is disposed in a common dielectric layer with said first and third lines.

14. The fuse of claim 12, wherein said fifth line is disposed in a common dielectric layer.

15. The fuse of claim 12, wherein said body comprises a metal silicide.

16. The fuse of claim 12, wherein said first line comprises tungsten.

17. The fuse of claim 12, wherein said plurality of vias comprise copper.

18. The fuse of claim 12, wherein said second line comprises copper.

* * * * *